United States Patent
Smaha

(10) Patent No.: US 10,554,062 B2
(45) Date of Patent: Feb. 4, 2020

(54) METHOD AND APPARATUS FOR BATTERY CHARGING

(71) Applicant: EH Europe GmbH, Zug (CH)

(72) Inventor: Jean-Patrick Smaha, Arras (FR)

(73) Assignee: EH Europe GmbH, Zug (CH)

( * ) Notice: Subject to any disclaimer, the term of this patent is extended or adjusted under 35 U.S.C. 154(b) by 0 days.

(21) Appl. No.: 15/749,902

(22) PCT Filed: Aug. 2, 2016

(86) PCT No.: PCT/EP2016/068457
§ 371 (c)(1),
(2) Date: Feb. 2, 2018

(87) PCT Pub. No.: WO2017/021419
PCT Pub. Date: Feb. 9, 2017

(65) Prior Publication Data
US 2018/0226825 A1    Aug. 9, 2018

(30) Foreign Application Priority Data

Aug. 4, 2015 (EP) ..................... 15306266

(51) Int. Cl.
*H02J 7/00* (2006.01)
*G01R 31/3832* (2019.01)

(52) U.S. Cl.
CPC ........ *H02J 7/0068* (2013.01); *G01R 31/3832* (2019.01); *H02J 7/007* (2013.01)

(58) Field of Classification Search
CPC ............... Y02E 60/12; G01R 31/3648; G01R 31/3651; G01R 31/3624; H02J 7/0047
USPC ....................................... 320/132
See application file for complete search history.

(56) References Cited

U.S. PATENT DOCUMENTS

| 6,294,894 | B1* | 9/2001 | Ochiai ................. G01R 31/396 320/132 |
| 2009/0153100 | A1* | 6/2009 | Okumura .............. H02J 7/0026 320/116 |
| 2011/0006737 | A1 | 1/2011 | Saligram et al. |
| 2015/0069954 | A1 | 3/2015 | Kechmire et al. |

FOREIGN PATENT DOCUMENTS

| DE | 102010027006 | 1/2012 |
| EP | 0994549 | 4/2000 |

OTHER PUBLICATIONS

International Search Report and Written Opinion for PCT/EP2016/068457 dated Oct. 11, 2016, 8 pages.
Notice of Opposition for corresponding EP Application No. 15306266.6 dated Oct. 23, 2019, 16 pages.

* cited by examiner

*Primary Examiner* — Arun C Williams
(74) *Attorney, Agent, or Firm* — Myers Bigel, P.A.

(57) ABSTRACT

The present invention concerns a method and apparatus for battery charging. The method comprises the steps of connecting a battery to a battery charging apparatus and supplying a voltage and current to the battery, wherein a constant voltage is supplied for an extended period of time. At the beginning of the constant voltage being supplied, the initial charging current being supplied to the battery is noted (Amp). During the period in which a constant voltage is supplied, the rate of change of the charging current supplied to the battery (dI/dt) is monitored. The method includes calculating the ratio: K=Amp/(dI/dt) during the period in which a constant voltage is supplied, and when K equals a preselected value, maintaining the charging current at the instant value for an extended period of time.

10 Claims, 4 Drawing Sheets

| | | %DOD C5 | Charge rate | CF at K= -35 | voltage regulation (Vpc) | T°C batt start charge | T°C batt start Ureg | T°C batt end charge | T°C batt max charge |
|---|---|---|---|---|---|---|---|---|---|
| 24 x 4XFC450 battery | Cycle #1 | 60% | 0,5C5 | 101,2% | 2,40 | 29,0 | 38,7 | 40,9 | 42,5 |
| | Cycle #2 | 60% | 0,5C5 | 100,4% | 2,40 | 33,6 | 42,9 | 45,2 | 46,2 |
| | Cycle #3 | 60% | 0,5C5 | 100,9% | 2,40 | 35,5 | 44,3 | 46,5 | 48,0 |
| | Cycle #4 | 60% | 0,5C5 | 100,2% | 2,40 | 34,7 | 43,9 | 46,1 | 47,2 |
| | Cycle #5 | 60% | 0,5C5 | 100,8% | 2,40 | 35,1 | 44,5 | 46,4 | 47,6 |
| | Cycle #6 | 100% | 0,5C5 | 99,4% | 2,40 | 27,5 | 42,8 | 45,5 | 47,6 |

Fig. 4

METHOD AND APPARATUS FOR BATTERY CHARGING

RELATED APPLICATIONS

The present application is a 35 U.S.C. § 371 national phase application of PCT International Application No. PCT/EP2016/068457, filed Aug. 2, 2016, which claims priority from European Patent Application No. 15306266.6, filed Aug. 4, 2015, the disclosures of which are hereby incorporated herein by reference in their entireties.

FIELD OF THE INVENTION

The present invention concerns a method and apparatus for battery charging. More particularly, but not exclusively, this invention concerns a method and apparatus for charging lead acid batteries, particularly lead acid batteries which power electromotive vehicles, such as fork lift trucks automated guided vehicles, tractors etc.

BACKGROUND OF THE INVENTION

In order to improve the lifetime performance of a battery, it may be necessary to alter the battery charging profile depending on the age, temperature, usage or other properties of the battery. Such arrangements are described in International Patent Publication Number WO 2011/015805 and WO 2011/015806. However, monitoring the age, temperature, usage, or other properties of the battery being charged adds to the complexity of the charging process.

It may also be preferable that in each battery charge, the battery is charged such that a certain charge factor value is reached. Monitoring the charge factor of a battery during a battery charging process may require complex battery monitoring apparatus to be used during the charging process, thus adding to the complexity and expense of a battery charging process.

The present invention seeks to mitigate the above-mentioned problems. Alternatively or additionally, the present invention seeks to provide an improved method and apparatus for charging a battery.

SUMMARY OF THE INVENTION

The present invention provides according to a first aspect, a method of charging a battery, the method comprising the steps of:
connecting a battery to a battery charging apparatus;
supplying a voltage and current to the battery, wherein a constant voltage is supplied for an extended period of time;
noting, at the beginning of the constant voltage being supplied, the initial charging current being supplied to the battery (I=Amp);
during the period in which a constant voltage is supplied, monitoring the rate of change of the charging current supplied to the battery (dI/dt);
calculating the ratio:

$$K = \text{Amp}/(dI/dt)$$

during the period in which a constant voltage is supplied;
when K equals a preselected value, maintaining the charging current at the instant value for an extended period of time.

The charge factor is the ratio of the charge input during a charging process to the charge output discharged since the previous charging process.

The inventors have determined that for a set battery, a certain value of K will indicate that the charge factor of approximately 1 has been reached during the charging process. It is then straightforward to move from the constant voltage charging phase to a constant current charging phase, for a set period of time determined to take the charge factor of the battery being charged to the optimum charge factor, for example 1.03. Effectively, the invention allows the battery to be taken to a reference point, i.e. a charge factor of 1, from which a final charge can be applied to take the charge factor to the optimum value. The method only requires the voltage and current being supplied to the battery to be monitored, and does not rely on the depth of discharge of the battery being known, or other battery characteristics such as battery age and/or battery temperature. The method according to the invention automatically adapts the charging profile of the battery charging process to that which is necessary to provide an optimally charged battery. This removes the need for the battery to communicate with the battery charging apparatus during the charging process, as the battery charging apparatus can carry out the appropriate monitoring and calculations. Therefore, a simplified method is provided compared with prior art methods of battery charging.

In order to determine the relevant K value for a particular type of battery, a number of tests may be performed. A battery may be charged and discharged a number of times on a test bench. The depth of discharge is known, and so it is relatively straightforward for a skilled person to calculate when the charge factor reached during a battery charging process is approximately equal to 1. The values of Amp and dI/dt are also monitored during the charging process, allowing the ratio K to be calculated for determining the K value which indicates that the charge factor is equal to 1.

In order to check the K value is appropriate, and not dependent on the temperature or usage of a battery, a number of checks may be carried out. A battery may be discharged a number of times with different depth of discharge, each time noting down the depth of discharge of the battery and the K value that is determined. Additionally, the battery temperature may be varied and monitored at various stages in a charging process. These stages may include some or all of the battery temperature at the start of the charge, battery temperature at the start of a regulation voltage being applied, the battery temperature at the end of the charge, and the maximum battery temperature during the charging process.

Once a K value has been determined, the variation of battery conditions as described may be used to provide a test structure, whereby the battery is charged under different conditions, using the K value which has already been determined. When the K value reaches the required value, the charging process is stopped, and the charge factor of the battery determined. Assuming that the charge factor is 1, or very close to 1, for example between 0.985 to 1.015, then the K value is verified as correct. The K value may then be used in a normal charging procedure, where a battery is connected to a battery charging apparatus in a working environment.

The method may include the step of applying a constant current charge prior to applying the constant voltage charge. The method may include the step of applying a constant current charge until the cell voltage in the battery reaches a set regulation voltage. The regulation voltage may be selected from a range of values between 2.10V per cell (V pc) and 2.50V pc, and preferably between 2.30V pc and 2.50V pc. The constant current may be selected to be in the range from between 20% and 70% of the battery capacity. The constant current may be selected to be 20% of the capacity of the battery. The constant current may be selected to be 70% of the capacity of the battery. The current may be selected to balance the speed of the required charge with maintaining the longevity of the battery life. The method may include the step of choosing one of a range of constant current values, based on whether a "normal" or "fast" charge is required.

According to a second aspect of the invention there is also provided a method of calibrating a battery charging method, the battery charging method as described according to the first aspect of the invention, the method comprising the steps of:

performing a series of battery discharge and charge cycles, the battery being connected to a test bench;

in each charge cycle, charging the battery such that a charge factor of one is reached, monitoring the value of K=Amp/(dI/dt), and recording the K value when the charge factor equals one, and storing the K value when the charge factor equals one for use in the battery charging method.

According to a third aspect of the invention, there is also provided a battery charging system, the battery charging system comprising a battery charging apparatus configured to supply a battery charging profile in accordance with the method as described according to the first aspect of the invention.

It will of course be appreciated that features described in relation to one aspect of the present invention may be incorporated into other aspects of the present invention. For example, the method of the invention may incorporate any of the features described with reference to the apparatus of the invention and vice versa.

DESCRIPTION OF THE DRAWINGS

Embodiments of the present invention will now be described by way of example only with reference to the accompanying schematic drawings of which:

FIG. 4 shows a table with test results relating to a calibration process according to a second embodiment of the invention.

DETAILED DESCRIPTION

Figure 1:
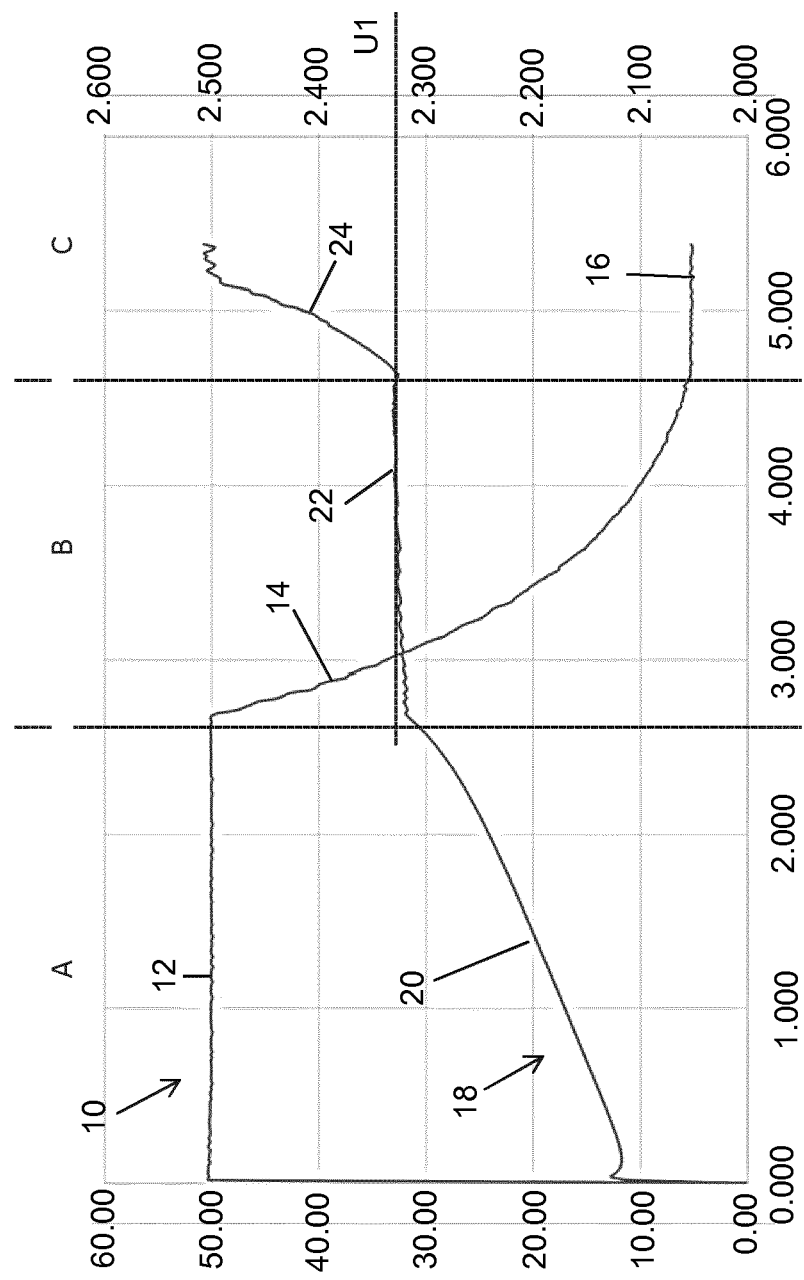
FIG. 1 shows a graph of a battery charging profile according to a first embodiment of the invention.
Figure 2:
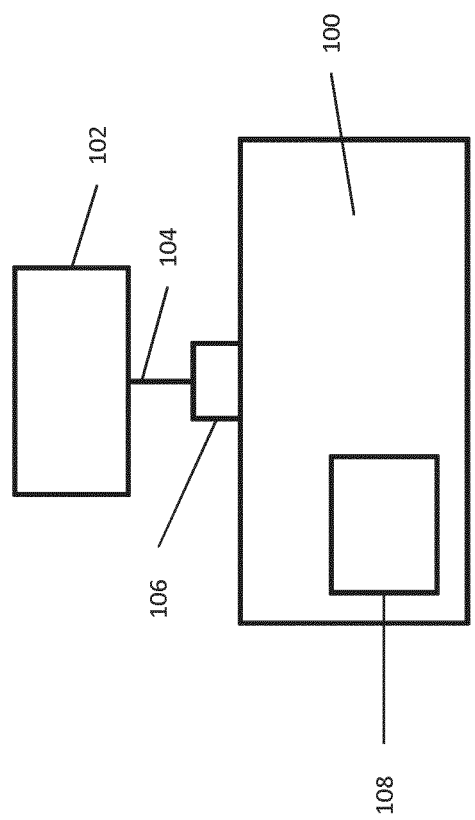
FIG. 2 shows a battery charging system arranged to supply a battery charging profile as shown in FIG. 1.

FIG. 1 shows an example charging profile according to the invention. FIG. 2 shows a battery charging system which is arranged to provide a charging profile as shown in FIG. 1.

FIG. 2 shows a battery charging system comprising a battery charging apparatus 100 connected to a battery 102 via battery charging leads 104. A shunt 106 is provided on the battery charging leads and is arranged to measure the current and voltage being supplied to the battery 102. The battery charging apparatus 100 comprises a control unit 108 which controls the current and voltage being supplied by the battery charging apparatus 100 to the battery 102. The control unit 108 also includes a central processing unit (CPU) 110 which is arranged to set the appropriate charging profile for the charging process. The CPU 110 is also arranged to monitor the K value during the charging process, and adjust the charging process accordingly.

FIG. 1 shows an IUI charging profile (constant current, constant voltage, constant current) for charging a 12 volt forklift truck battery. The charging current, generally indicated by the reference 10, moves between three phases, as indicated by the letters A, B, and C. Firstly, in phase A, the charging current has a constant phase 12 where the current is approximately constant with time, followed by a decreasing phase 14 (indicated as phase B), where the current value decreases with time, and a final constant phase 16 (indicated as phase C), where the current is approximately constant with time. The voltage, generally indicated by the reference 18, of the charging profile also varies across the three phases, with an increasing phase 20 (phase A), where the voltage increases with time, a constant phase 22 (phase B), where the voltage is approximately constant with time, and a final increasing phase 24 (phase C), where the voltage increases with time. The voltage indicated on the scale on the right hand axis of the graph is the voltage for a single cell, so the values on this scale have to be multiplied by 6 for a 12V forklift truck battery. As can be seen, the initial constant current phase 12 corresponds with the increasing voltage phase 20, the decreasing current phase 14 corresponds with the constant voltage phase 22, and the final constant current phase 16 corresponds with the final increasing voltage phase 24.

The value of the initial charging current 12 is determined based on the speed of charging requirements. The battery charging apparatus may include more than one battery charging profile, for example, a "normal" charge profile, and a "fast" charge profile. The value of the initial charge may be chosen to be between 20% and 70% of the capacity of the battery. Typically, for a normal charge, the value of the initial charging current is set to be approximately 20% of the capacity of the battery being charged. If a faster charging time is required, the initial charging current 12 may be set to be approximately 70% of the battery capacity. The voltage supplied by the battery charging apparatus increases in order to maintain the constant charging current 12, as can be seen in FIG. 1. When the voltage across the battery cells reaches a regulation voltage U1, the battery charging process moves into the constant voltage phase, indicated in FIG. 1 by the reference B. The regulation voltage is set by the manufacturer of a battery for use during the charging of the battery, and in the case shown in FIG. 1, U1 is approximately 2.32V pc (or 13.92V for a 12V battery).

The current and voltage being supplied by the battery charging apparatus 100 is monitored by a shunt 106 located on the battery charging connection 104. Alternatively, the shunt 106 may be located on the battery charging apparatus 100. The value of the current 12 being supplied by the battery charging apparatus when the battery charging profile moves into the constant voltage phase B, is noted as being I=Amp. During the constant voltage phase, the current 14 supplied by the battery charging apparatus is constantly decreasing. The rate of decrease, dI/dt, is monitored by the CPU 108 associated with the shunt 106 located on the battery charging connection 104. The CPU 108 calculates a ratio K, where K=Amp/(dI/dt) during the constant voltage phase B. When the K value matches a predetermined value, the charge factor of the battery is approximately 1 (plus or minus 1.5 percent). In the example shown in FIG. 1, the value of K when the charge factor is approximately 1, is −35. At this point, the battery charger maintains the current at the instant value (approximately 5 A in the present example), without voltage limitation, to complete the charge. This is shown as phase C in FIG. 1. The length of time the current 16 is maintained at the constant value, with the increasing voltage 24 is calculated based on the battery reaching the optimum charge factor that has been determined for that battery type. For example, it may be a charge factor of 1.03.

An advantage provided by the invention is giving a simple method by which a battery being charged may be charged to a state in which the charge factor is 1, without needing to know the depth of discharge of the battery prior to the initiation of the charging process. Once the battery has reached the charge factor equals 1 position, it provides a fixed point from which the optimum final charge factor may be reached.

The applicant has found that the method of monitoring the constant voltage phase of the charging process allows the charge factor to be determined independently of the depth of discharge of the battery, the age of the battery, and the battery temperature during the charging process. The method also provides a method of monitoring and controlling the battery charging process without requiring there to be any communication between the battery 102 being charged and the battery charging apparatus 100. Instead, the battery charging process may be monitored and controlled based on the readings taken by a shunt 106 located on the battery charging connector 104.

The value of K that indicates the charge factor of a battery has reached 1 is determined by running tests on that battery type. The battery is connected to a discharge bench, where the battery is discharged, and the depth of discharge is monitored. The battery is then charged according to the charging profile shown in FIG. 1. As the depth of discharge is known, it is straightforward to determine when the charge factor is 1. Therefore, by testing a battery under various different conditions, varying the depth of discharge and the temperature of the battery, the value of K can be determined, as shown in the table in FIG. 4, which represents such a test charging and discharging process. The K value may then be applied to a normal charging process, where the depth of discharge of the battery being charged is not known.

Figure 3:
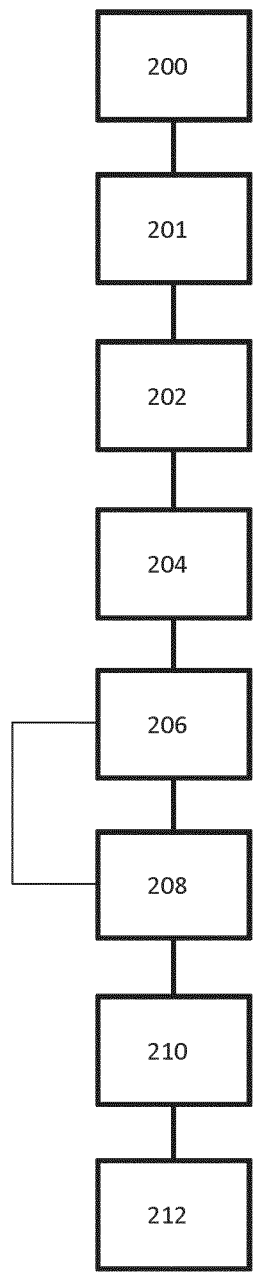
FIG. 3 shows a flow chart of battery charging steps according to a first embodiment of the invention.

FIG. 3 shows a flowchart including various steps of the invention, according to the first embodiment. The first step 200 comprises connecting a battery to be charged to the battery charging apparatus 100. Then a constant current is applied to the battery in step 201. Once the regulation voltage U1 has been reached across the battery cells, the battery charging apparatus 100 starts supplying a constant voltage to the battery in step 202. The initial charging current applied when the constant voltage is applied is noted as I=Amp in step 204. The rate of change of the current (dI/dt) as the constant voltage is applied is monitored in step 206. A ratio, K=Amp/(dI/dt) is calculated during the constant voltage phase in step 208. If K is not equal to a predetermined value, x, then the constant voltage continues to be applied to the battery as shown in the flowchart. If K=x, then the current being applied to the battery is kept constant at the same value as when K=x, for a set period of time, as shown in step 210. Once the constant current has been applied for a set time period, the charging process finishes 212.

FIG. 4 shows a series of test results obtained during a calibration process according to a second embodiment of the invention. A battery is connected to a test bench, and discharged and charged a number of times. As can be seen from the table, there are six cycles, the first five with a depth of discharge of 60 percent and the final with a depth of discharge of 100 percent. The charge rates and voltage regulation are also shown, together with the temperature of the battery at the start of the charge, when the battery starts a constant voltage phase, the battery temperature at the end of the battery charge, and the maximum battery temperature during the charge. It can be seen that when the ratio K is equal to minus 35, the charge factor of the battery ranges from 1.012 to 99.4. Therefore, regardless of the temperature of the battery, or the depth of discharge, a K value of minus 35 returns a battery with a charge factor of approximately 1. Therefore, the K value of minus 35 may be applied when charging a similar battery according to the method of the first embodiment of the invention such that the battery is charged to a charge factor of approximately 1, using only a shunt monitoring the current and voltage supplied to the battery via the battery charging apparatus.

Whilst the present invention has been described and illustrated with reference to particular embodiments, it will be appreciated by those of ordinary skill in the art that the invention lends itself to many different variations not specifically illustrated herein. By way of example only, certain possible variations will now be described.

The use of the K value may be used in any charging profile where there is a constant voltage stage. For example, the method may be applicable to a constant power, constant voltage, constant current (WUI) charging profile, or a constant current, constant voltage, constant current (IUIo) charging profile, or a constant current, constant voltage, constant current, constant voltage (IUIUo) charging profile.

Where in the foregoing description, integers or elements are mentioned which have known, obvious or foreseeable equivalents, then such equivalents are herein incorporated as if individually set forth. Reference should be made to the claims for determining the true scope of the present invention, which should be construed so as to encompass any such equivalents. It will also be appreciated by the reader that integers or features of the invention that are described as preferable, advantageous, convenient or the like are optional and do not limit the scope of the independent claims. Moreover, it is to be understood that such optional integers or features, whilst of possible benefit in some embodiments of the invention, may not be desirable, and may therefore be absent, in other embodiments.

The invention claimed is:

1. A method of charging a battery, the method comprising the steps of:
   connecting a battery to a battery charging apparatus;
   supplying a voltage and current to the battery, wherein a constant voltage is supplied for an extended period of time;
   noting, at the beginning of the constant voltage being supplied, the initial charging current being supplied to the battery (I=Amp);
   during the period in which a constant voltage is supplied, monitoring the rate of change of the charging current supplied to the battery (dI/dt);
   calculating the ratio:

$$K=\text{Amp}/(dI/dt)$$

during the period in which a constant voltage is supplied;
   when K equals a preselected value, maintaining the charging current at the instant value for an extended period of time.

2. A method as claimed in claim 1, the method including the step of applying a constant current charge prior to applying the constant voltage charge.

3. A method as claimed in claim 2, the method including the step of applying a constant current charge until the cell voltage in the battery reaches a set regulation voltage.

4. A method as claimed in claim 3, wherein the regulation voltage is selected from a range of values between 2.30V pc and 2.50V pc.

5. A method as claimed in claim 2, where the value of the initial charge is chosen to be between 20% and 70% of the capacity of the battery.

6. A method as claimed in claim 5, wherein the constant current is selected to be 20% of the capacity of the battery.

7. A method as claimed in claim 5, wherein the constant current is selected to be 70% of the capacity of the battery.

8. A method as claimed in claim 5, including the step of choosing one of a range of constant current values available.

9. A method of calibrating a battery charging method, the battery charging method as described according to claim 1, the method comprising the steps of:
- performing a series of battery discharge and charge cycles, the battery being connected to a test bench;
- in each charge cycle, charging the battery such that a charge factor of one is reached,
- monitoring the value of $K=Amp/(dI/dt)$, and recording the K value when the charge factor equals one, and
- storing the K value when the charge factor equals one for use in the battery charging method as claimed in claim 1.

10. A battery charging system, the battery charging system comprising a battery charging apparatus configured to supply a battery charging profile in accordance with the method as described according to claim 1.

* * * * *

UNITED STATES PATENT AND TRADEMARK OFFICE
CERTIFICATE OF CORRECTION

PATENT NO. : 10,554,062 B2
APPLICATION NO. : 15/749902
DATED : February 4, 2020
INVENTOR(S) : Jean-Patrick Smaha Page 1 of 1

It is certified that error appears in the above-identified patent and that said Letters Patent is hereby corrected as shown below:

On the Title Page

Item (30) Foreign Application Priority Data:
Please correct "(EP) 15306266" to read -- (EP) 15306266.6 --

Signed and Sealed this
Second Day of June, 2020

Andrei Iancu
*Director of the United States Patent and Trademark Office*